United States Patent [19]
Krueger

[11] Patent Number: 6,002,632
[45] Date of Patent: Dec. 14, 1999

[54] CIRCUITS, SYSTEMS, AND METHODS WITH A MEMORY INTERFACE FOR AUGMENTING PRECHARGE CONTROL

[75] Inventor: Steven D. Krueger, Dallas, Tex.

[73] Assignee: Texas Instruments Incorporated, Dallas, Tex.

[21] Appl. No.: 09/154,992

[22] Filed: Sep. 17, 1998

[51] Int. Cl.[6] .................................................. G11C 8/00
[52] U.S. Cl. ..................... 365/230.03; 365/191; 395/834
[58] Field of Search .............................. 395/497.01, 834; 365/203, 191, 84, 129, 189.05, 189.08, 230.03, 235, 238.5, 230.01

[56] References Cited

U.S. PATENT DOCUMENTS 5,701,438  12/1997  Bains ................................. 395/497.01
5,802,395   9/1998  Connolly et al. ....................... 395/834

*Primary Examiner*—David Nelms
*Assistant Examiner*—Thong Le
*Attorney, Agent, or Firm*—Robby T. Holland; Carlton H. Hoel; Richard L. Donaldson

[57] ABSTRACT

A digital computing system (30). The digital computing system includes a memory (36) and a memory controller (34). The memory comprises at least one memory bank (B0), and that bank comprises a plurality of rows ($R_0$–$R_N$) and a plurality of columns ($C_0$–$C_N$). The memory controller circuit is coupled to control the memory, and comprises a first bus (38) for providing an address to the memory, and three additional buses (38, 40). A first of these additional buses provides a row address strobe signal (RAS*) to the memory, where assertion of the row address strobe signal represents an indication that an address on the bus is a valid row address directed to one of the plurality of rows. A second of these additional buses provides a column address strobe signal (CAS*) to the memory, where assertion of the column address strobe signal represents an indication that an address on the bus is a valid column address directed to at least one of the plurality of columns. A third of these additional buses provides a bank close signal (BC*) to the memory, where assertion of the bank close signal represents a request to the memory to immediately de-activate an active one of the plurality of rows.

24 Claims, 3 Drawing Sheets

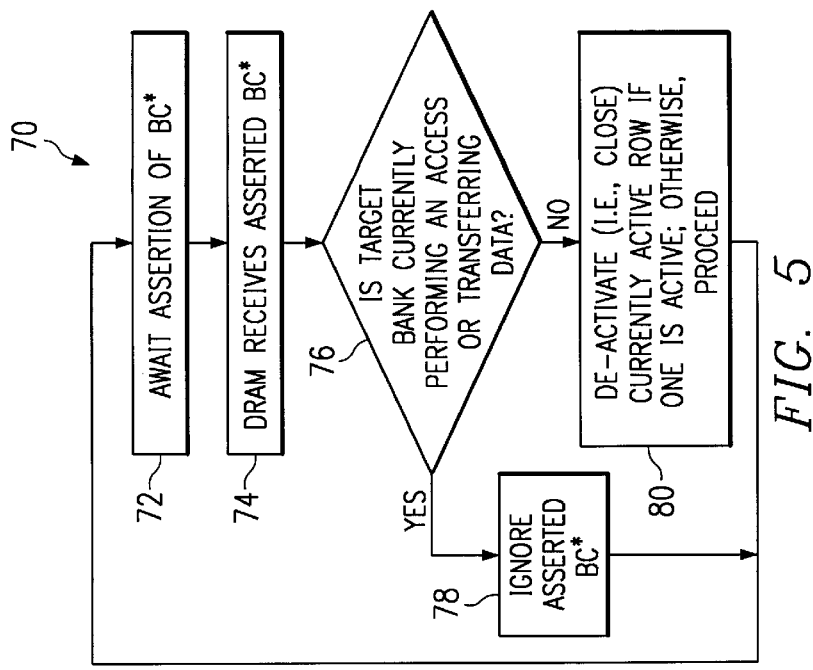
FIG. 5
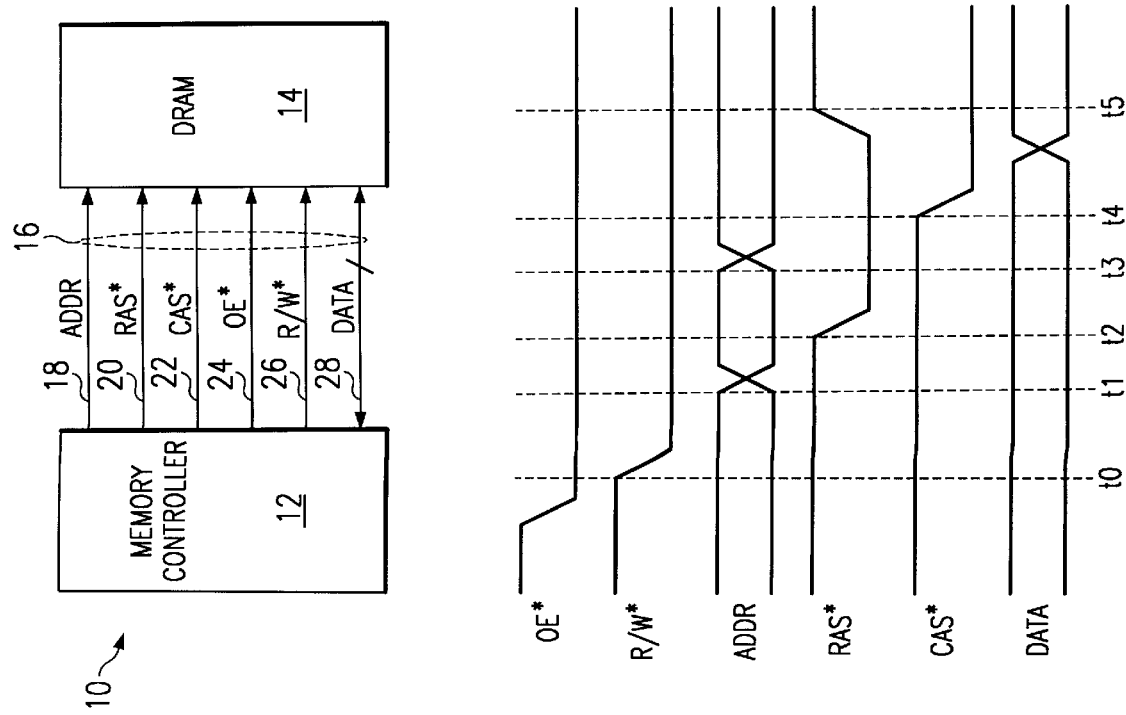
FIG. 1a (PRIOR ART)
FIG. 1b (PRIOR ART)

CIRCUITS, SYSTEMS, AND METHODS WITH A MEMORY INTERFACE FOR AUGMENTING PRECHARGE CONTROL

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to memory control in digital computing systems, and are more particularly directed to circuits, systems, and methods in these environments for more efficiently controlling precharging of memory banks.

Memory control is typically accomplished in the computing art by a mechanism referred to as a memory controller, or often as a DRAM controller since dynamic random access memory ("DRAM") is often the type of memory being controlled. A DRAM controller may be a separate circuit or a module included within a larger circuit, and typically receives requests for accessing one or more memory locations in the corresponding memory. To respond to each request, the memory controller implements sufficient circuitry (e.g., address decoders and logic decoders) to provide the appropriate control signals to a memory so that the memory is properly controlled to enable and disable its storage circuits.

While some DRAM controllers are directed to certain improvements in memory access efficiency, it has been observed in connection with the present inventive embodiments that some limitations arise under current technology. These limitations are caused by DRAM controllers when activating or de-activating memory rows. To better illustrate these operations and the corresponding drawbacks, FIG. 1a illustrates a block diagram of a portion of a prior art computing system 10. System 10 includes a memory controller 12 which receives a REQUEST from an addressing component (not shown) either within or having access to system 10. In response to the REQUEST, memory controller 12 controls a DRAM 14 so that data is either read from, or written to, DRAM 14 in an orderly fashion. More particularly, this control is accomplished via a control bus 16, which typically includes the following six signals and corresponding conductors, where a more detailed discussion of the function of these signals is presented later: (1) an address signal ADDR on a multiple conductor line 18, where the number of conductors is selected according to the number of address bits to be communicated to DRAM 14; (2) a row address strobe signal RAS* on a conductor 20, where the superscript asterisk indicates that the signal is an active low signal (and where this same convention is used for other signals hereafter used in this document); (3) a column address strobe signal CAS* on a conductor 22; (4) an output enable signal OE* on a conductor 24; (5) a read/write R/W* signal on a conductor 26, and a DATA signal on a multiple line conductor 28, where the number of conductors is selected according to the number of data bits to be communicated to or from DRAM 14. Lastly, note that bus 16 may include still additional signals not shown in FIG. 1a but known in the art, such as a chip enable signal and a CKE signal. These and other signals, however, are not detailed here so as to simplify and focus the following discussion.

The operation of the above-introduced conductors may be appreciated further from the timing diagram of FIG. 1b, which depicts the control signals communicated from memory controller 12 to DRAM 14 to accomplish a single access of DRAM 14 along with the output of DATA from DRAM 14 in response to the control signals. For the present example, this single access is a read operation with it understood that a write operation is similar in various timing respects and in any event will be appreciated by one skilled in the art. First, before time t0, the output enable signal OE* is asserted and, as a result, the data output of DRAM 14 is permitted to occur, that is, the output is not placed in a high impedance state which is what occurs when the output enable signal OE* is de-asserted. Next, at time t0, the R/W* is asserted low, thereby indicating that the next access to occur is a read. Next, at t1, the row address for the desired read of DRAM 14 is asserted on address conductors 18. Next, at t2, RAS* is asserted low, thereby indicating that the row address on address conductors 18 is valid and, thus, thereby causing that row address to be accepted by DRAM 14 for decoding and activation of the appropriate row in DRAM 14. Next, at t3, the column address for the desired read of DRAM 14 is asserted on address conductors 18. In this regard, note therefore that address conductors 18 may carry either a row or column address and, thus, it is the assertion of either RAS* or CAS* that determines the interpretation of which type of address is being communicated. Thus, at t4, CAS* is asserted low, thereby indicating that the column address on address conductors 18 is valid and, thus, thereby providing a column address which, when decoded by DRAM 14, causes one or more columns of the activated row to be selected. In response, the data for the selected column(s) is output from the data array of DRAM 14 and coupled to multiple line conductor 28, thereby providing the DATA signal so the data is available for any circuit having access to that conductor.

The preceding illustration and example, while relatively straightforward and well known in the art, provide a background to further introduce drawbacks which arise from the current state of the art as memory systems become more complex than that shown in FIG. 1. More particularly, the above process typically repeats for each access of a row in DRAM 14. Further in this regard, FIG. 1b illustrates a time t5 at which RAS* is de-asserted. In response, the row which is currently active is de-activated, typically by pre-charging the bit lines which allow access to that row. In this regard and importantly, note that a sufficient amount of time must pass for this precharging operation to reach a satisfactory state of equilibrium, that is, to fully precharge the cell before it may be accessed another time. Thus, for each operation of a row access, there is not only the time to access the row in response to the assertion of RAS* and CAS*, but there is also the time to conclude the access and then prepare for the next access by de-asserting RAS* (i.e., precharging the cell) for a sufficient period of time. Stated in an alternative manner, before a next row may be accessed, the previous row must be de-activated (e.g., precharged), and in the prior art that is commonly achieved by the RAS* signal, either alone or in combination with yet additional signals. Thus, in a worst case scenario, both of these times aggregate to impose overhead on DRAM 14, that is, time in which no data is communicated on conductor 28. Additionally, and as improved upon by the inventive embodiments described later, note that this type of precharge operation requires that at least conductor 20 of bus 16 become available before a row may be de-activated, and often this event does not occur until some delay in time due to its relation to other signals of bus 16.

The above conditions may be further complicated where, as is becoming more frequent in contemporary systems, DRAM 14 is a multiple bank memory. For example, DRAM 14 may include two, four, or some other number of banks in excess of one bank, where each bank may be accessed independently of the other. Such multiple bank systems sometimes are implemented in a manner which permits some type of concurrency, meaning an operation may be taken with respect to one of the banks while a different operation is taken with respect to a different one of the banks. Accordingly, this concurrency may reduce overall overhead as compared to a system with a single bank having a storage capacity equal to the total storage capacity of the multiple bank system Nevertheless, the addressing scheme of FIGS. 1a and 1b, or a variant thereof, usually is imposed in such a system. Once again, therefore, there are constraints due to the time required by both activating and precharging a row in one bank before then activating the next row in the same bank. In addition, note that it is contemplated in some multiple bank systems to leave a row in a given bank active for as long as possible, where there is hope or expectation that multiple addresses to the given bank will be to the same row. In this manner, since the row is left active, the data may be communicated with respect to the row without interjecting precharge sequences of that row between each successive access. However, the present inventor recognizes that even in such approaches at some point it is still required that the row will no longer be active, such as when an address is received to the same bank and is directed to a different row. At this point, therefore, once again the type of scheme depicted by FIG. 1a will cause overhead delay due to the precharging of one row and the activation of another row through the operation of the RAS* and possibly related signals.

In view of the above, there arises a need to address the drawbacks of the prior art and provide improved memory control for reducing memory access latency.

BRIEF SUMMARY OF THE INVENTION

In one embodiment there is a digital computing system. The system includes a memory and a memory controller. The memory comprises at least one memory bank, and that bank comprises a plurality of rows and a plurality of columns. The memory controller circuit is coupled to control the memory, and comprises a first bus for providing an address to the memory, and three additional buses. A first of these additional buses provides a row address strobe signal to the memory, where assertion of the row address strobe signal represents an indication that an address on the bus is a valid row address directed to one of the plurality of rows. A second of these additional buses provides a column address strobe signal to the memory, where assertion of the column address strobe signal represents an indication that an address on the bus is a valid column address directed to at least one of the plurality of columns. A third of these additional buses provides a bank close signal to the memory, where assertion of the bank close signal represents a request to the memory to immediately de-activate an active one of the plurality of rows. Other circuits, systems, and methods are also disclosed and claimed.

BRIEF DESCRIPTION OF THE SEVERAL VIEWS OF THE DRAWING

FIG. 1a illustrates a block diagram of a prior art digital computing system implementing a memory controller connected to control a dynamic random access memory;

FIG. 1b illustrates a timing diagram illustrating the operation of the system of FIG. 1a;

FIG. 5 illustrates a flow chart of the operation of the memory of FIG. 3 with respect to the response to the bank close signal which may issue from the operation illustrated in the flow chart of FIG. 4.

DETAILED DESCRIPTION OF THE INVENTION

Figure 2:
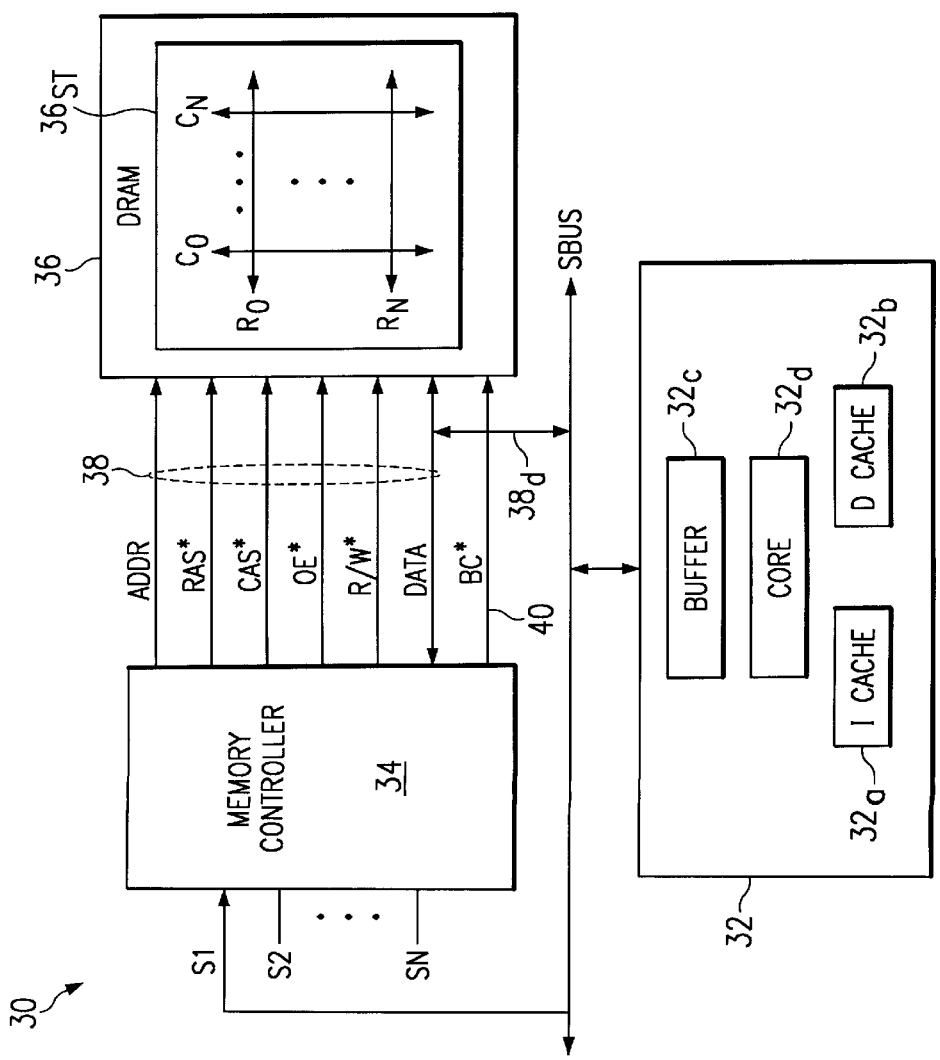
FIG. 2 illustrates a block diagram of a digital computing system platform in which the preferred embodiment may be implemented.

FIG. 2 illustrates a preferred embodiment of a general digital computer platform 30 into which various of the memory (e.g., DRAM) control embodiments described in this document may be implemented. The components of platform 30 may be formed on an single integrated circuit or, alternatively, various different components may be formed in two or more integrated circuits. However, fewer or a single integrated circuit is preferred, and also is more likely to create a platform where greater emphasis is placed on the type of time savings and efficiency improvements as may be achieved by the memory control and memory operation described below. In any event, the particular number of circuits is selectable by one skilled in the art.

Turning now to the general components of platform 30, it includes a general purpose host processor 32. Host processor 32 may include various elements known in the processor art, and by way of example therefore it is shown in FIG. 1 as having an instruction cache 32a and a data cache 32b, each of which may have a corresponding memory management unit (not shown). Moreover, while only these caches are illustrated, it should be understood that additional levels of cache may be included within host processor 32. Host processor 32 further includes buffer circuitry 32c and an operating core 32d, which along with caches 32a and 32b all communicate with a system bus SBUS. While not separately shown, it is to be understood that the SBUS includes data, address, and control conductors.

The SBUS is further coupled to a memory controller 34 which, as detailed later, operates in response to memory access requests to control a dynamic random access memory ("DRAM") 36. While a single DRAM 36 is shown, note that an alternative embodiment contemplates using additional DRAMs, but the example of a single DRAM is discussed here to simplify the remaining discussion. DRAM 36 includes a storage area $36_{ST}$, which comprises a plurality of rows $R_0$ through $R_N$ and a plurality off columns $C_0$ through $C_N$. As detailed later, these rows and columns may be part of either a single memory bank or of multiple memory banks. As a matter of introduction to memory control in platform 30, between memory controller 34 and DRAM 36 is a multiple conductor bus 38, where in the preferred embodiment bus 38 includes various conductors, which may be considered separate buses of one or more conductors each, preferably to provide the same signals as described in connection with the prior art system 10 of FIG. 1a. Briefly reviewing those signals, they include an address signal ADDR, a row address strobe signal RAS*, a column address strobe signal CAS*, an output enable signal OE*, a read/write R/W* signal, and a DATA signal. Further with respect to the DATA signal, note that a separate data bus $38_d$ is shown coupled between bus 38 and the SBUS, where it is intended to demonstrate that data via this coupling may be communicated between the SBUS and DRAM 36. Additionally, while not shown it should be appreciated that data may be communicated either to or from DRAM 36 via other connections as well. In all events, such communications occur in response to memory access requests.

Memory access requests in the preferred embodiment may be communicated to memory controller 34 from the SBUS and, thus, FIG. 2 illustrates the connection of the SBUS to memory controller 34 as a first source S1 of a memory address request. This request may be from any circuit appropriately coupled to communicate with the SBUS, such as operating core 32 of host processor 32, or its caches 32a and 32b (or their corresponding memory management units). In addition to these potential sources of memory access requests, it is contemplated that system 30 includes alternatives sources which may require access to DRAM 36, where these sources may be directly connected to memory controller 34 and, thus, are indicated in FIG. 2 as sources S2 through SN. Such sources, for example, could include additional processors (e.g., a digital signal processor) and other peripherals including circuits for video functionality, network functionality, and still others as will be ascertainable by one skilled in the art. Lastly with respect to memory accesses, and importantly for the preferred embodiment, note that memory controller 34 further provides what is referred to in this document as a bank close signal BC* via a conductor 40. Thus, the BC* signal is in addition to the prior art signals provided along bus 38. As detailed below, the BC* signal permits more efficient operation of system 10 by reducing overhead when a new request is directed to a row in DRAM 36 which is not currently active.

Figure 3:
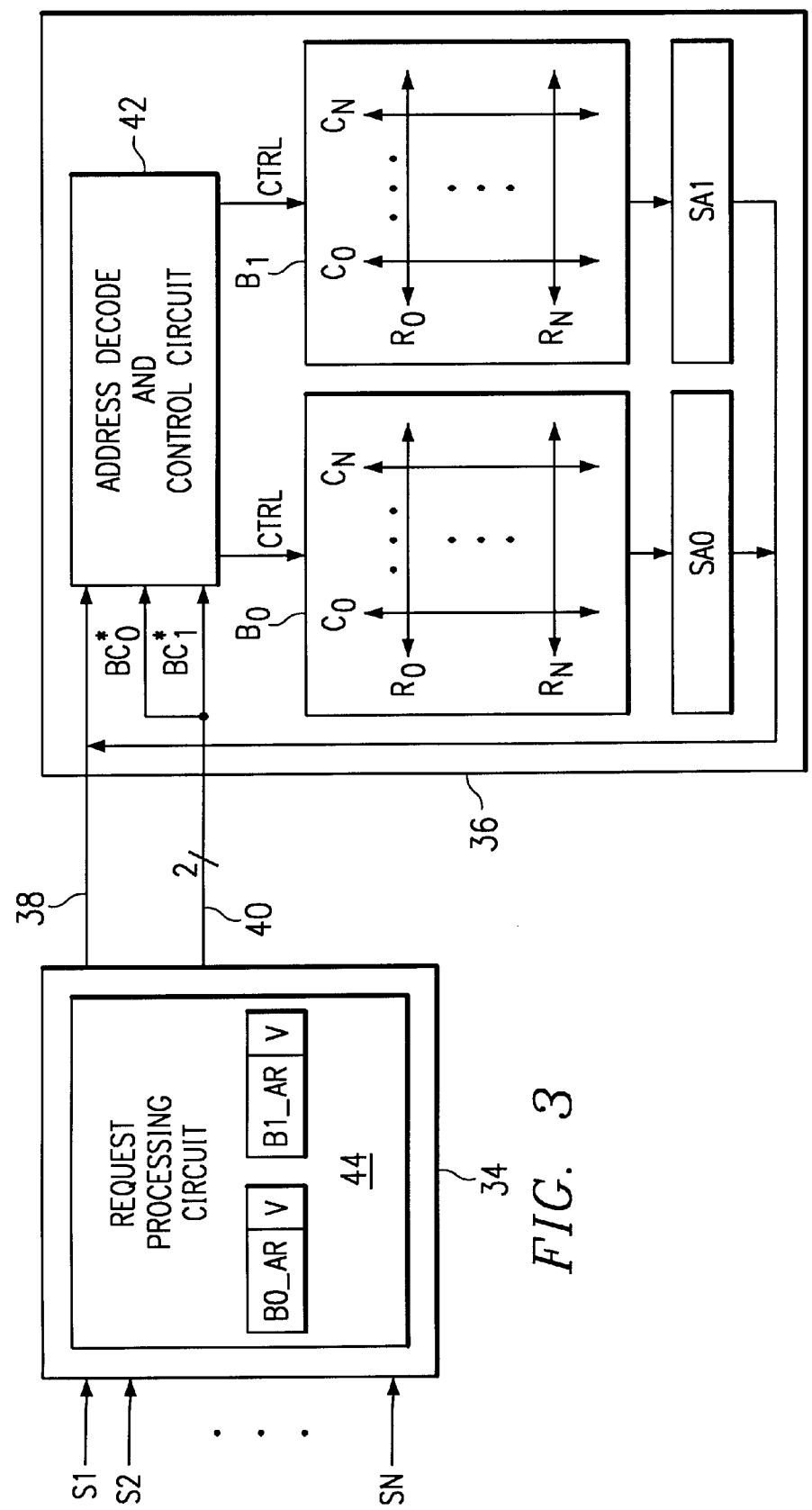
FIG. 3 illustrates a block diagram of the memory controller and memory of FIG. 2 in greater detail.

FIG. 3 illustrates memory controller 34 and DRAM 36 in greater detail to illustrate various inventive aspects described in still greater detail later in connection with the flow chart of FIG. 4. By way of introduction, however, note that the illustration of FIG. 3 is simplified in that only a minimal amount of circuitry is shown for each component so as to support the functionality detailed below. Nevertheless, it is contemplated that numerous other aspects may be included in each of memory controller 34 and DRAM 36 as will be apparent to one skilled in the art.

Looking first to DRAM 36, it may be implemented as man) different types of available DRAM architectures. As a first example, DRAM 36 may be a synchronous dynamic random access memory ("SDRAM"). As a second example, DRAM 36 may be a fast page mode DRAM. In this type of DRAM and as known in the art, the constraints on the control provided by the CAS and RAS signals (whether active low or otherwise) are such that once a row is activated via RAS, multiple accesses may be made to different columns of that same row by consecutively asserting and de-asserting CAS, leaving RAS unasserted for each of the CAS transitions. As a third example, DRAM 36 may be a static column DRAM. In this type of DRAM and also as known in the art, once a row is activated through the operation of RAS, the column address operates in a manner comparable to an asynchronous SRAM. In other words, CAS may be left in a single state (e.g., active rather than toggling it) with different column addresses applied to the memory in which case, for each different column address and after a delay time following application of the different column address, different columns of the same row are accessed. As a fourth example, DRAM 36 may be an extended data out ("EDO") memory which, as known in the art, has a slightly relaxed limitation on the CAS signal in that it may be de-asserted and yet for some slight period thereafter the data output by the memory remains valid (as opposed to other memories which require CAS to remain asserted during the entire time that data is expected to be valid).

Continuing the examination of DRAM 36, note that as illustrated it is a multiple bank memory, where by way of example in FIG. 3 the number of banks equals two, as shown by a first bank B0 and a second bank B1. Each of banks B0 and B1 includes a plurality of rows $R_0$ through $R_N$ and a plurality of columns $C_0$ through $C_N$. In addition, each of banks B0 and B1 is connected to a a corresponding sense amplifier circuit SA0 and SA1, where the sense amplifiers operate as known in the art to permit data communication from and to a bank. Also in regard to the notion of multiple banks, note two additional observations. First, it is contemplated that the inventive teachings of this document will likely provide greater enhancement to a multiple bank memory as is typically the case for an SDRAM, yet various of the teachings may nevertheless also be included in a single bank memory system. Second, the use of a two bank memory of FIG. 3 is merely by way of illustration and, thus, other numbers of multiple banks are contemplated as falling within the overall inventive scope. Regardless of the number of banks, it is important for the preferred embodiment that DRAM 36 further support the receipt of a bank close signal BC* introduced above. Indeed, and for reasons detailed later, in one embodiment note that separate bank close signals are provided from memory controller 34 to DRAM 36 for each of the banks in DRAM 36. Thus, since there are two banks B0 and B1 in the example of FIG. 3, then there are two corresponding bank close signals indicated as $BC_0^*$ and $BC_1^*$. Bank close signals $BC_0^*$ and $BC_1^*$, as well as the control signals of bus 38, are connected to an address decode and control circuit 42. With the exception of responding to bank close signals $BC_0^*$ and $BC_1^*$ as detailed later, address decode and control circuit 42 operates and includes circuitry as known in the art and, thus, generally decodes an incoming address, according to timing considerations discussed below, and activates a row and columns in the appropriate bank so information may be either written to, or read from, the active row.

Looking now to memory controller 34, each of the sources S1 through SN which may present a memory access request is coupled to a request processing circuit 44. Request processing circuit 44 includes a storage circuit corresponding to each of the banks of the memory it is intended to control; thus, in the present embodiment, where DRAM 36 has two banks B0 and B1 and is controlled by memory controller 34, then request processing circuit 44 includes two storage circuits B0_AR and B1_AR corresponding to banks B0 and B1. More particularly, each of storage circuits B0_AR and B1_AR is included to store an identifier of the row, if any, which is active in the corresponding bank. For example, if row R is active in bank B0, then an identifier of row R is stored in storage circuit B0_AR. Thus, in one embodiment, storage circuits B0_AR and B1_AR are implemented as registers, with each having ample storage to identify a row such as by storing the row address. In this approach, when memory controller 34 receives a request for a memory access and processes that request to activate a row in DRAM 36, the portion of that request which forms the row address is stored in the appropriate one of storage circuits B0_AR and B1_AR. Naturally under such an approach, the portion of the request which identifies the appropriate bank is used to direct the row address into the appropriate one of storage circuits B0_AR and B1_AR. For example, if an access request is received by memory controller 34 and is directed to bank B1 of DRAM 36, then request processing circuit 44 determines from a bit in the request that the request is directed to bank B1 and, consequently, the row address from the request is copied to storage circuit B1_AR.

In addition to storing a row identifier, it is further preferred that one or more additional bits may be associated with each of storage circuits B0_AR and B1_AR to assist in additional complexities, such as to indicate whether the identifier in the corresponding storage circuit at a given time is valid. Thus, in FIG. 3, each of storage circuits B0_AR and B1_AR is shown as including a corresponding valid bit V. Continuing with the preceding example where an access request to bank BI is received, note then that the valid bit associated with storage circuit B1_AR is not yet set to valid when the request is received by memory controller 34 since the actual row sought to be addressed is not yet active. Instead, it is only once memory controller 34 issues the appropriate control to DRAM 36 (e.g., asserting RAS* low) that the valid bit for storage circuit B1_AR is set to valid, thereby indicating that at that time the row indicated in storage circuit B1_AR is active. In this same manner, if memory controller 34 later takes an action to deactivate the row at issue then the valid bit for storage circuit B1_AR is set to invalid.

Figure 4:
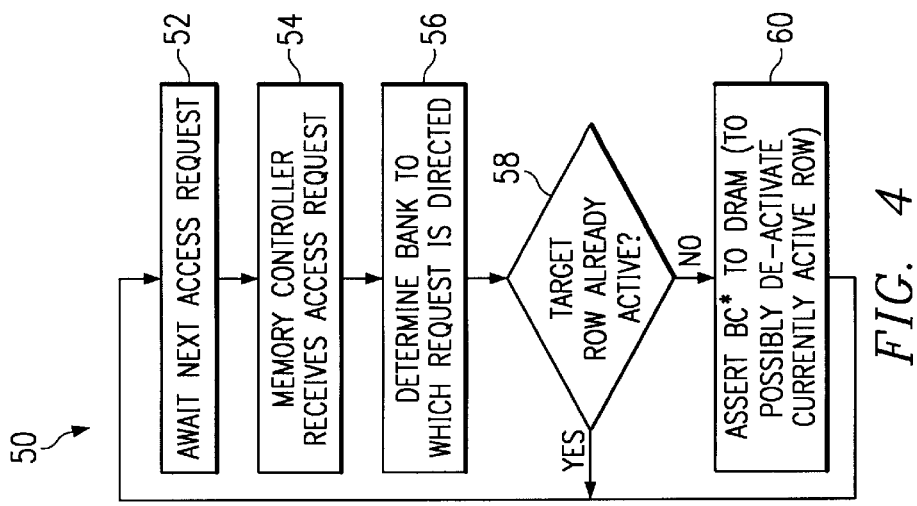
FIG. 4 illustrates a flow chart of the operation of the memory controller of FIG. 3 with respect to the issuance of a bank close signal.

FIG. 4 illustrates a flow chart of a method 50 which depicts in greater detail the operation of memory controller 34. Method 50 begins with step 52, which simply represents a wait state during which memory controller 34 awaits a next memory access request from any of sources S1 through SN. At this point and also by way of introduction, note that method 50, as appreciated by the end of the discussion of FIG. 4, is primarily directed to the control of the bank close signal(s) BC*. Thus, the wait state of step 52 is only intended to indicate that no action is currently taken with respect to a bank close signal BC*, yet it should be understood that memory controller 34 may at the same time be performing other functionality as implemented by one skilled in the art. In any event, following step 52 method 50 continues to step 54.

In step 54, memory controller 34 receives an access request from any of sources S1 through SN. This request is coupled to request processing circuit 44, which generally performs the remaining steps of method 50 in response to the received request. In this regard, it should be noted that the following functionality may be performed in various manners, such as by the implementation of a state machine or other logic to achieve the functions set forth above. Moreover, given the functional statements of this document, such a state machine or other logic should be readily ascertainable by one skilled in the art. In any event, for the remaining discussion and by way of presenting an example to follow through method 50, assume that the access request is from source S2. Once an access request is received, method 50 continues to step 56.

In step 56, request processing circuit 44 determines the bank of DRAM 36 to which the received access request is directed. Stated simply for the example of FIG. 3, therefore, step 56 determines whether the access request is directed to bank B0 or to bank B1. This determination is preferably made by evaluating the appropriate address bit(s) included in the request which are directed to the bank portion of the address. Additionally, if the number of banks implemented in DRAM 36 is greater than two, then the determination of step 56 is made in view of that larger number. Alternatively, if only one bank is implemented in DRAM 36, then step 56 may be eliminated. For the remaining discussion and by way of presenting an example to follow through method 50, assume that the request from source S2 is directed to bank B1. Moreover, for purposes of convention for the remainder of this document, the bank to which the request is directed is referred to as the target bank, and the row in that bank to which the request is directed is referred to as the target row.

In step 58, request processing circuit 44 determines whether the target row in DRAM 36 to be accessed in response to the access request received in step 54 is already active. In the preferred embodiment, this function is performed by examining the contents and valid bit of the appropriate one of storage circuits B0_AR and B1_AR. Recall in the current example that the target bank is bank B1, as determined by step 56. Thus, if the valid bit of storage circuit B1_AR is set to valid (i.e., indicating the row identified by that circuit is currently active), then step 58 determines whether the target row of the access request matches the row identified in storage circuit B1_AR. In one embodiment, this determination is made by comparing the row address from the access request with the row address stored in storage circuit B1_AR. If the target row sought is the same as the already active row in the target bank (e.g., a match in the compared addresses occurs), then method 50 returns to step 52 to await the next access request. Given this occurrence, the method is effectively complete and no action is taken with respect to the bank close signal BC*. Once more, however, note that method 50 is primarily directed to the bank close signal BC* and, thus, the match found in this case may cause other actions to be taken by memory controller 34 (e.g., in regard of maintaining a row active in DRAM 36 for a successive access). Nevertheless, such additional actions are not the focus of the present discussion and, thus, are left to be ascertained by one skilled in the art. On the other hand, if the row sought to be accessed by the request is different than the already active row for the bank at issue (e.g., a mis-match in the compared addresses occurs), then method 50 continues to step 60.

In step 60, having been reached because the target row is different than the already active row for the target bank, memory controller 34 asserts the bank close signal BC* to DRAM 36. More particularly, where DRAM 36 has multiple banks as in the case of the example of FIG. 3, the bank close signal directed to the bank to be accessed in response to the request received in step 54 is asserted. Recall for the present example it is assumed that bank B1 is to be accessed. Thus, for that instance and assuming step 60 is reached, then request processing circuit 44 asserts bank close signal $BC_1$* corresponding to bank B1. As demonstrated below in connection with FIG. 5, a possible response to this assertion of a bank close signal is to de-activate (or "close", as the signal name "bank close" suggests) the currently active row on that bank, and the reasons for such action are also detailed below. In any event, after the bank close signal is asserted, method 50 returns to step 52 and, thus, once again awaits the next access request from any of sources S1 through SN.

FIG. 5 illustrates a flow chart of a method 70 which depicts in greater detail the operation of address decode and control circuit 42 of DRAM 36. Method 70 begins with step 72, which simply represents a wait state during which DRAM 36 is awaiting the next assertion of a bank close signal BC* from memory controller 34. During step 72 and before an asserted bank close signal BC* is received, DRAM 36 preferably operates in any manner either known to the prior art or contemplated by one skilled in the art. In other words, at this point, DRAM 36 remains responsive to any other signals on bus 38 from memory controller 34, where again those signals are likely to include the CAS* and RAS* signals and possibly others directed at addressing rows and columns of the memory. Also by way of introduction, note that method 70, as appreciated by the end of the discussion of FIG. 5, is primarily directed to the response to receiving an asserted one of the bank close signal(s) BC*. Thus, the wait state of step 72 is only intended to indicate that no action is currently taken with respect to BC*, yet it should be understood that DRAM 36 may at the same time be performing other functionality as implemented by one skilled in the art. In any event, following step 72 method 70 continues to step 74.

In step 74, DRAM 36 receives an asserted bank close signal from memory controller 34. This signal is coupled to address decode and control circuit 42 which generally performs the remaining steps of method 70 in response to the asserted signal. In this regard, note that the following functionality may be performed in various manners, such as by the implementation of a state machine or other logic to achieve the functions set forth above. Once again, given the functional statements of this document, such a state machine or other logic should be readily ascertainable by one skilled in the art. In addition, the following discussion is directed to the operation of a single state machine by way of example, but it should be understood that the present inventive scope further comprehends multiple state machines, with each state machine corresponding to one of the possible bank close signals. In this regard, therefore, each state machine may be in a different state than the other(s) and, thus, the analyses of the operation in response to the corresponding bank close signal may occur independently yet concurrently with other analyses then occurring with respect to one or more other bank close signals. In any event, for the remaining discussion and by way of presenting an example to follow through method 70, assume a single state machine and that the preceding example from FIG. 4 carries forward to FIG. 5, that is, that an access request is from source S2 to access bank B1. To further facilitate this example, assume now that the access request was to a row that was not already active and, thus, method 50 of FIG. 4 operated to assert bank close signal $BC_1$*. Once the asserted bank close signal is received, method 70 continues to step 76.

In step 76 address decode and control circuit 42 determines whether the bank corresponding to the asserted bank close signal BC* is either currently performing an access or currently transferring data. For purposes of the present document, each of these different conditions is as follows. Performance of an access occurs when the cells of a bank row are currently activated and data is either being written to those cells, or read from those cells, via the corresponding sense amplifier circuit. Data transfer is at a level external from the cells, that is, where the data bus to the memory (e.g., via bus 38) is busy carrying data either to or from the memory. In either event, and for reasons more clear at the conclusion of the FIG. 5 discussion, it is not desirable under the preferred embodiment to stop these events in response to an asserted bank close signal once they have started. Thus, if either of these events is occurring at the time the asserted bank close signal is received, then method 70 continues from step 76 to step 78 which ignores the asserted bank close signal (i.e., discards it) and then returns to the wait state of step 72. On the other hand, if neither of these events is occurring (and nor is some other event which is ascertained by one skilled in the art as undesirable to terminate), then method 70 continues from step 76 to step 80.

In step 80, address decode and control circuit 42 determines whether the bank corresponding to the asserted bank close signal BC* currently has a row active. If not, then method 70 merely returns from step 80 with no additional action to the wait state of step 72. If a row in the corresponding bank is active, and having received the bank close signal BC*, then the active row is de-activated (i.e., closed). In other words, in response to receipt of the bank close signal BC*, address decode and control circuit 42 issues a control signal to the appropriate bank to immediately de-activate (or "close") that row (or at least to take this action after whatever delay occurs in response to this control signal). In the preferred embodiment, de-activation is achieved by address decode and control circuit 42 precharging the bit lines coupled to the row. Thereafter, method 70 returns from step 80 to the wait state of step 72.

Having concluded the steps of FIG. 5, and in combination with the steps of FIG. 4, it is now helpful to present various observations in connection with the preceding operations and their benefits. Specifically, from the above one skilled in the art will appreciate that the above operations permit a row in a given memory bank to remain active for successive accesses, until a request is received to access a different target row in the same target bank. Once a request access is received and directed to a different target row in the same target bank, the combination of the resulting asserted bank close signal BC* and the response to it by DRAM 36 permit the target bank to immediately de-activate the currently active row in that target bank. This is in contrast to the prior art, which generally relies on either the RAS* signal or its combination with other signals to de-activate a row in a bank. In other words, the existence and action of the bank close signal permits an immediate effort to be made toward de-activating a row without having to wait for bus 38, which includes the RAS* signal, to become available. To further appreciate this contrast, under the prior art if bus 38 is busy due to an access to either the same bank to be next accessed or yet a different bank in DRAM 36, then an overhead delay follows in that once bus 38 becomes available, it is used to control the RAS* signal (and possibly others) to at that point de-activate one row in the target bank and thereafter activate the target row in the target bank. In contrast, however, the existence and action of the bank close signal allows the current row to be de-activated prior to bus 38 becoming available and, thus, this operation occurs concurrently with the current use of bus 38 and is effectively hidden either partially or completely from overhead (i.e., from the time when bus 38 must be used for purposes other than transferring data). Consequently, under the preferred embodiment when bus 38 becomes available, and assuming the bank close signal has already caused de-activation to commence, then the precharging operation has already begun. Accordingly, if the precharging operation has begun but full precharge equilibrium has not yet occurred, there is still a reduced amount of time required to wait before the next access of the cell may commence as compared with the prior art wherein the precharge could not even commence until bus 38 were available. Moreover, if the precharging operation which resulted from the bank close signal has continued over a sufficiently long period of time such that precharge equilibrium has been achieved by the time bus 38 becomes available, then once bus 38 becomes available it may be used immediately to begin the steps to activate the target row since the previously active row has been sufficiently precharged in response to the already-asserted and independently supplied bank close signal.

From the above, it may be appreciated that the above embodiments reduce memory access latency by reducing overhead when a successive access is to a DRAM target row other than an already active row. In addition to the above teachings, it should be noted that while the present embodiments have been described in detail, various substitutions, modifications or alterations could be made to the descriptions set forth above without departing from the inventive scope. For example, while memory controller 34 in the preferred embodiment maintains a separate record of the active rows in DRAM 36, in an alternative embodiment DRAM 36 could include a manner of reporting this information back to memory controller 34 without therefore requiring memory controller 34 to separately maintain this information. As another example, while FIG. 2 illustrates only a single DRAM, the present inventive teachings comprehend a multiple DRAM system such as where such devices are used to provide additional data width by accessing them with the same ADDR, RAS*, CAS* and OE* signals, but with separate DATA signals. In this case, the same bank control signals BC* are also connected to each of the multiple DRAMs. As still another example, the present inventive teachings also contemplate multiple DRAM devices used to obtain additional storage depth by accessing them with different combinations of the ADDR, RAS*, CAS* and OE* signals, and using the same DATA signals. In this case, the banks of each of the DRAM devices are treated as separate banks giving rise to a total number N of banks, and each of the N banks is connected to receive an independent bank control signal. As yet another example, different control signals may be included within the general bus 38 coupled between memory controller 34 and DRAM 36, while still maintaining the separate functionality and benefits provided by the bank close signal. As another example, platform 30 of FIG. 2 is a general block diagram. Thus, additional features may be included, and modifications may be made, although such are not shown to simplify the illustration and focus the discussion to DRAM and memory control aspects. As a final example, platform 30 is only by way of illustration, and it should be understood that numerous of the inventive aspects may be implemented in other systems having memory control such as DRAM control. Thus, the previous description, these examples, and other matters ascertainable by one skilled in the art given the present teachings should help illustrate the inventive scope, as defined by the following claims.

I claim:

1. A digital computing system, comprising:
   a memory comprising at least one memory bank, the at least one bank comprising a plurality of rows and a plurality of columns;
   a memory controller circuit coupled to control the memory, and comprising:
      a first bus for providing an address to the memory;
      a second bus for providing a row address strobe signal to the memory, wherein assertion of the row address strobe signal represents an indication that an address on the first bus is a valid row address directed to one of the plurality of rows;
      a third bus for providing a column address strobe signal to the memory, wherein assertion of the column address strobe signal represents an indication that an address on the first bus is a valid column address directed to at least one of the plurality of columns; and
      a fourth bus for providing a bank close signal to the memory, wherein assertion of the bank close signal represents a request to the memory to immediately de-activate an active one of the plurality of rows.

2. The system of claim 1 wherein the memory controller further comprises:
   a circuitry for receiving signals representative of a request to access the memory;
   a determining circuitry for determining whether the request is directed to one of the plurality of rows which is currently active in the memory; and
   a circuitry for issuing the bank close signal in response to the determining circuitry determining that the request is directed to one of the plurality of rows which is not currently active in the memory.

3. The system of claim 1 wherein the memory further comprises:
   a circuitry for receiving the bank close signal; and
   a deactivating circuitry for deactivating an active row in the plurality of rows in response to receiving the bank close signal.

4. The system of claim 3 wherein the deactivating circuitry does not deactivate an active row in the plurality of rows if a data access is being performed in the at least one bank at the time the bank close signal is received by the deactivating circuitry.

5. The system of claim 3 wherein the deactivating circuitry does not deactivate an active row in the plurality of rows if data is being transferred from a data bus coupled to the memory at the time the bank close signal is received by the deactivating circuitry.

6. The system of claim 3:
   wherein the deactivating circuitry does not deactivate an active row in the plurality of rows if a data access is being performed in the at least one bank at the time the bank close signal is received by the deactivating circuitry; and
   wherein the deactivating circuitry does not deactivate an active row in the plurality of rows if data is being transferred from a data bus coupled to the memory at the time the bank close signal is received by the deactivating circuitry.

7. The system of claim 3 wherein the deactivating circuitry of the memory is for deactivating the active row by applying a precharge signal to bit lines corresponding to the active row.

8. The system of claim 1:
   wherein the at least one bank comprises a first bank;
   wherein the memory comprises a plurality of banks including the first bank;
   wherein the memory controller comprises a plurality of bank close buses including the fourth bus;
   wherein each of the plurality of bank close buses corresponds to one of the plurality of banks; and
   wherein each of the plurality of bank close buses is for providing a corresponding bank close signal to a corresponding one of the plurality of banks, wherein assertion of any of the corresponding bank close signals represents a request to the memory to immediately de-activate an active row in the corresponding one of the plurality of banks.

9. The system of claim 1 wherein de-assertion of the row address strobe signal represents a request to the memory to de-activate an active one of the plurality of rows.

10. The system of claim 1 wherein the memory comprises a dynamic random access memory.

11. The system of claim 1 wherein the memory comprises a synchronous dynamic random access memory.

12. The system of claim 1 wherein the memory comprises a fast page mode dynamic random access memory.

13. The system of claim 1 wherein the memory comprises a static column dynamic random access memory.

14. The system of claim 1 wherein the memory comprises an extended data out memory.

15. The system of claim 1 wherein the at least one bank is a single bank in the memory.

16. The system of claim 1 and further comprising a processor core coupled to issue a request to access the memory of the memory controller, wherein the bank close signal is responsive to the request.

17. The system of claim 1:

wherein the memory comprises a first memory;

wherein the memory controller circuit is coupled to control a second memory; and wherein the memory controller further comprises a fifth bus for providing a bank close signal to the second memory, wherein assertion of the bank close signal represents a request to the second memory to immediately de-activate an active row in the second memory.

18. A memory controller circuit coupled to control a memory, the memory comprising at least one memory bank, the at least one bank comprising a plurality of rows and a plurality of columns, the memory controller circuit comprising:

a first bus for providing an address to the memory;

a second bus for providing a row address strobe signal to the memory, wherein assertion of the row address strobe signal represents an indication that an address on the first bus is a valid row address directed to one of the plurality of rows;

a third bus for providing a column address strobe signal to the memory, wherein assertion of the column address strobe signal represents an indication that an address on the first bus is a valid column address directed to at least one of the plurality of columns; and a fourth bus for providing a bank close signal to the memory, wherein assertion of the bank close signal represents a request to the memory to immediately de-activate an active one of the plurality of rows.

19. The memory controller of claim 18 and further comprising:

circuitry for receiving signals representative of a request to access the memory;

determining circuitry for determining whether the request is directed to one of the plurality of rows which is currently active in the memory; and circuitry for issuing the bank close signal in response to the determining circuitry determining that the request is directed to one of the plurality of rows which is not currently active in the memory.

20. The memory controller of claim 18:

wherein the at least one bank comprises a first bank;

wherein the memory comprises a plurality of banks including the first bank;

wherein the memory controller comprises a plurality of bank close buses including the fourth bus;

wherein each of the plurality of bank close buses corresponds to one of the plurality of banks; and wherein each of the plurality of bank close buses is for providing a corresponding bank close signal to a corresponding one of the plurality of banks, wherein assertion of any of the corresponding bank close signals represents a request to the memory to immediately de-activate an active row in the corresponding one of the plurality of banks.

21. A memory, comprising:

at least one memory bank, the at least one bank comprising a plurality of rows and a plurality of columns;

a plurality of inputs, each for coupling to a corresponding one of a plurality of buses, the plurality of buses comprising:

a first bus for providing an address to the memory;

a second bus for providing a row address strobe signal to the memory, wherein assertion of the row address strobe signal represents an indication that an address on the first bus is a valid row address directed to one of the plurality of rows;

a third bus for providing a column address strobe signal to the memory, wherein assertion of the column address strobe signal represents an indication that an address on the first bus is a valid column address directed to at least one of the plurality of columns; and a fourth bus for providing a bank close signal to the memory, wherein assertion of the bank close signal represents a request to the memory to immediately de-activate an active one of the plurality of rows.

22. The memory of claim 21 and further comprising:

circuitry for receiving the bank close signal; and deactivating circuitry for deactivating an active row in the plurality of rows in response to receiving the bank close signal.

23. The memory of claim 22 wherein the deactivating circuitry does not deactivate an active row in the plurality of rows if a data access is being performed in the at least one bank at the time the bank close signal is received by the deactivating circuitry.

24. The memory of claim 22 wherein the deactivating circuitry does not deactivate an active row in the plurality of rows if data is being transferred from a data bus coupled to the memory at the time the bank close signal is received by the deactivating circuitry.

* * * * *